(12) United States Patent
Wang et al.

(10) Patent No.: US 12,249,612 B2
(45) Date of Patent: Mar. 11, 2025

(54) FINGERPRINT RECOGNITION MODULE AND DRIVING METHOD THEREOF, AND DISPLAY APPARATUS

(71) Applicants: Beijing BOE Sensor Technology Co., Ltd., Beijing (CN); BOE Technology Group Co., Ltd., Beijing (CN)

(72) Inventors: Kuiyuan Wang, Beijing (CN); Cheng Li, Beijing (CN); Yue Geng, Beijing (CN); Yi Dai, Beijing (CN); Zefei Li, Beijing (CN); Chaoyang Qi, Beijing (CN); Zhonghuan Li, Beijing (CN); Xiaoguan Li, Beijing (CN); Congcong Xi, Beijing (CN); Yajie Feng, Beijing (CN); Yingzi Wang, Beijing (CN)

(73) Assignees: Beijing BOE Sensor Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/756,688

(22) PCT Filed: May 31, 2021

(86) PCT No.: PCT/CN2021/097456
§ 371 (c)(1),
(2) Date: May 31, 2022

(87) PCT Pub. No.: WO2022/252067
PCT Pub. Date: Dec. 8, 2022

(65) Prior Publication Data
US 2024/0304636 A1 Sep. 12, 2024

(51) Int. Cl.
*G06V 40/13* (2022.01)
*H01L 27/146* (2006.01)

(52) U.S. Cl.
CPC .... *H01L 27/14607* (2013.01); *G06V 40/1318* (2022.01); *H01L 27/1462* (2013.01); *H01L 27/14612* (2013.01)

(58) Field of Classification Search
CPC .......... H01L 27/14607; H01L 27/1462; H01L 27/14612; G06V 40/1318
See application file for complete search history.

(56) References Cited

U.S. PATENT DOCUMENTS

2015/0021613 A1 1/2015 Hayashi et al.
2016/0365465 A1* 12/2016 Zheng ............... H01L 27/14692
(Continued)

FOREIGN PATENT DOCUMENTS

| CN | 101308856 A | 11/2008 |
|---|---|---|
| CN | 106022276 A | 10/2016 |

(Continued)

OTHER PUBLICATIONS

Translation of CN 112420791 A (Year: 2021).*
Translation of JP2016219704 A (Year: 2016).*

*Primary Examiner* — Lixi C Simpson
(74) *Attorney, Agent, or Firm* — Workman Nydegger

(57) ABSTRACT

A fingerprint recognition module is disclosed, and including: a base substrate; a driving circuit layer disposed on a side of the base substrate, and including a plurality of driving transistors arranged in an array; a first insulating layer disposed on a side of the driving circuit layer facing away from the base substrate, and including a plurality of first via holes running through the first insulating layer in a thickness direction of the first insulating layer; a plurality of photoelectric converters disposed on a side of the first insulating layer facing away from the driving circuit layer, and in contact with first electrodes of the plurality of driving transistors through the plurality of first via holes in one-to-
(Continued)

one correspondence; a second insulating layer disposed on a side of the first insulating layer facing away from the base substrate.

18 Claims, 5 Drawing Sheets

(56) References Cited

U.S. PATENT DOCUMENTS

| | | |
|---|---|---|
| 2017/0003770 A1* | 1/2017 | Akhavan Fomani ... G06F 3/041 |
| 2018/0102393 A1 | 4/2018 | Liu et al. |
| 2019/0130155 A1 | 5/2019 | Park |
| 2020/0202098 A1 | 6/2020 | Zou et al. |
| 2021/0133418 A1* | 5/2021 | Liu .................... G06V 40/1318 |
| 2022/0165780 A1 | 5/2022 | Geng et al. |

FOREIGN PATENT DOCUMENTS

| | | |
|---|---|---|
| CN | 110060635 A | 7/2019 |
| CN | 112420791 A | 2/2021 |
| CN | 112464799 A | 3/2021 |
| IN | 107946324 A | 4/2018 |
| JP | 2016219704 A * | 12/2016 |
| TW | I721661 B | 3/2021 |

* cited by examiner

FINGERPRINT RECOGNITION MODULE AND DRIVING METHOD THEREOF, AND DISPLAY APPARATUS

CROSS-REFERENCE TO RELATED APPLICATION

This application is a national phase entry under 35 U.S.C § 371 of International Application No. PCT/CN2021/097456, filed May 31, 2021.

FIELD

The present disclosure relates to the field of fingerprint recognition, in particular to a fingerprint recognition module and a driving method thereof, and a display apparatus thereof.

BACKGROUND

An optical fingerprint sensor is an apparatus that utilizes principles of refraction and reflection of light to collect fingerprints. Fingerprint recognition is one of the most widely used and cheapest recognition technologies in biometric technologies, and its market will continue to maintain a steady growth rate. At present, a fingerprint recognition technology is mainly used in mobile devices, security fields, enterprise attendance checking and intelligent community access control systems. With maturity of the technology and decrease of cost, application fields of the fingerprint recognition technology are becoming more and more extensive.

In the case of a traditional fingerprint sensor, a finger is put on an optical lens and the finger is irradiated by a built-in light source which emits light from a bottom. The emitted light is refracted on an uneven line pattern of a fingerprint on a surface of the finger at different angles and brightness of reflected light will be different. A photodetector converts a light signal into an electrical signal, and then forms a digital multi-grayscale fingerprint image with black ridges and white valleys (concave parts between the ridges) that can be processed by a fingerprint device algorithm.

However, due to inherent defects of a material, the optical fingerprint sensor will collect residue of a previous frame of image during image acquisition, resulting in a blurred image and low fingerprint image quality. The phenomenon is more obvious especially in an environment of strong light and low temperature, affecting image quality and accuracy of fingerprint identification, and increasing a false identification rate. Existing fingerprint sensor modules are still to be improved so as to ensure image quality and increase fingerprint identification accuracy.

SUMMARY

Embodiments of the present disclosure provide a fingerprint recognition module, the fingerprint recognition module includes:
 a base substrate;
 a driving circuit layer, disposed on a side of the base substrate, and the driving circuit layer includes a plurality of driving transistors arranged in an array;
 a first insulating layer, disposed on a side of the driving circuit layer facing away from the base substrate, and the first insulating layer includes a plurality of first via holes running through the first insulating layer in a thickness direction of the first insulating layer;
 a plurality of photoelectric converters, disposed on a side of the first insulating layer facing away from the driving circuit layer, and in contact with first electrodes of the plurality of driving transistors through the plurality of first via holes in one-to-one correspondence;
 a second insulating layer, disposed on a side of the first insulating layer facing away from the base substrate, and the second insulating layer includes a plurality of second via holes in one-to-one correspondence with the plurality of photoelectric converters, a distance between an edge of an orthographic projection of a region of a second via hole exposing a corresponding photoelectric converter on the base substrate and an edge of an orthographic projection of a surface of the corresponding photoelectric converter facing away from the base substrate on the base substrate is smaller than or equal to a first preset value; and
 a plurality of first electrodes, disposed on sides of the plurality of photoelectric converters facing away from the driving circuit layer, and each of the plurality of first electrodes covers, at the corresponding second via hole, the corresponding photoelectric converter.

In some embodiments, the distance between an edge of an orthographic projection of a region of a second via hole exposing a corresponding photoelectric converters on the base substrate and an edge of an orthographic projection of a surface of the corresponding photoelectric converters facing away from the base substrate on the base substrate is smaller than or equal to a first preset value is larger than or equal to 0.5 μm and is smaller than or equal to 2 μm.

In some embodiments, a distance between an edge of an orthographic projection, on the base substrate, of the first electrodes and the edge of the orthographic projection, on the base substrate, of the surface of the corresponding photoelectric converter facing away from the base substrate is larger than or equal to 0 μm and is smaller than or equal to 0.5 μm.

In some embodiments, an orthographic projection of the photoelectric converter on the base substrate is located within an orthographic projection of a corresponding first via holes on the base substrate.

In some embodiments, the first electrode of each of the plurality of driving transistors includes: a first part, and a second part connected with the first part:
 the orthographic projection of the first via hole on the base substrate is located within an orthographic projection of the first parts on the base substrate, and a pattern of the orthographic projection of the first via hole on the base substrate is similar to a pattern of the orthographic projection of the first part on the base substrate.

In some embodiments, a ratio of an area of the orthographic projection of the first via hole on the base substrate to an area of the orthographic projection of the first parts on the base substrate is larger than or equal to 70% and is smaller than or equal to 90%.

In some embodiments, the pattern of the orthographic projection of the first via hole on the base substrate is similar to a pattern of the orthographic projection of the photoelectric converter on the base substrate.

In some embodiments, a ratio of an area of the orthographic projection of the photoelectric converter on the base substrate to the area of the orthographic projection of the first via hole on the base substrate is larger than or equal to 90% and is smaller than or equal to 100%.

In some embodiments, a lateral surface of the photoelectric converter has a chamfer on a side close to the driving transistor.

In some embodiments, the chamfer is an inner chamfer curved toward a center of the photoelectric converter.

In some embodiments, a shape of an orthographic projection of the chamfer on the base substrate is an arc or a zigzag line.

In some embodiments, the driving circuit layer specifically includes:
a first conducting layer, including: control electrodes of the plurality of driving transistors, and a plurality of scanning signal lines;
a gate insulating layer, disposed on a side of the first conducting layer facing away from the base substrate;
an active layer, disposed on a side of the gate insulating layer facing away from the first conducting layer; and
a second conducting layer, disposed on a side of the active layer facing away from the gate insulating layer, and the second conducting layer includes: the first electrodes and second electrodes of the plurality of driving transistors, and a plurality of data signal lines, the data signal lines and the scanning signal lines intersect with each other to define a plurality of fingerprint recognition units, and the data signal lines are electrically connected with the second electrodes of the driving transistors.

In some embodiments, the fingerprint recognition module further includes:
a plurality of data reading units electrically connected with the data signal lines in a one-to-one correspondence mode, and the data reading unit includes: an operational amplifier circuit, a storage circuit, and a switch circuit; a first input end of the operational amplifier circuit is coupled to a corresponding data signal line, a first end of the storage circuit and a first end of the switch circuit, an output end of the operational amplifier circuit is coupled to a second end of the storage circuit and a second end of the switch circuit, and the output end of the operational amplifier circuit is configured to output a fingerprint recognition signal according to data signals input by the corresponding data signal line.

In some embodiments, the operational amplifier circuit includes: a first amplifier;
a first input end of the first amplifier is coupled to the corresponding data signal line, the first end of the storage circuit and the first end of the switch circuit, and a second input end of the first amplifier is grounded.

In some embodiments, the storage circuit includes: a first capacitor;
a first electrode of the first capacitor is coupled to the first input end of the operational amplifier circuit, and a second electrode of the first capacitor is coupled to an output the end of the operational amplifier circuit.

In some embodiments, the switch circuit includes: a first switch;
a first end of the first switch is coupled to the first input end of the operational amplifier circuit, and a second end of the first switch is coupled to the output end of the operational amplifier circuit.

In some embodiments, the fingerprint recognition module further includes:
a third insulating layer, disposed on a side of the second insulating layer facing away from the first insulating layer, and including a plurality of third via holes;
a third conducting layer, disposed on a side of the third insulating layer facing away from the second insulating layer, and being in contact with the plurality of first electrodes through the plurality of third via holes;
a fourth insulating layer, disposed on a side of the third conducting layer facing away from the third insulating layer;
a shading metal layer, disposed on a side of the fourth insulating layer facing away from the third conducting layer, and an orthographic projection of the shading metal layer on the base substrate covers an orthographic projection of the active layer of the driving transistors on the base substrate;
a fifth insulating layer, disposed on a side of the shading metal layer facing away from the fourth insulating layer, and the fifth insulating layer includes a plurality of fourth via holes running through the fifth insulating layer in a thickness direction of the fifth insulating layer; and
a shielding layer, disposed on a side of the fifth insulating layer facing away from the shading metal layer, and being in contact with the shading metal layer through the fourth via holes.

In some embodiments, a distance between an edge of an orthographic projection of the third via holes on the base substrate and the edge of the orthographic projection of the surface of the photoelectric converter facing away from the base substrate on the base substrate is larger than or equal to 3 μm and is smaller than or equal to 6 μm.

A method for driving a fingerprint recognition module provided by the embodiments of the present disclosure includes:
in an image-sticking removal stage, controlling a driving transistor of the fingerprint recognition module to be turned on, and providing an image-sticking removal signal to a photoelectric converter; and
in an image collection stage, controlling the driving transistor of the fingerprint recognition module to be turned off, and providing a common voltage signal to the photoelectric converter.

In some embodiments, the image-sticking removal signal is electrically opposite to the common voltage signal.

In some embodiments, the image-sticking removal signal is a positive voltage signal, and the common voltage signal is a negative voltage signal.

A display apparatus provided by the embodiments of the present disclosure includes the fingerprint recognition module provided by the embodiments of the present disclosure.

BRIEF DESCRIPTION OF THE DRAWINGS

In order to more clearly illustrate technical solutions in embodiments of the present disclosure, the accompanying drawings required in the description of the embodiments will be briefly introduced below. Obviously, the accompanying drawings in the following description are only some embodiments of the present disclosure. For those of ordinary skill in the art, other drawings can also be obtained from these drawings without any creative effort.

DETAILED DESCRIPTION OF THE EMBODIMENTS

Figure 1:
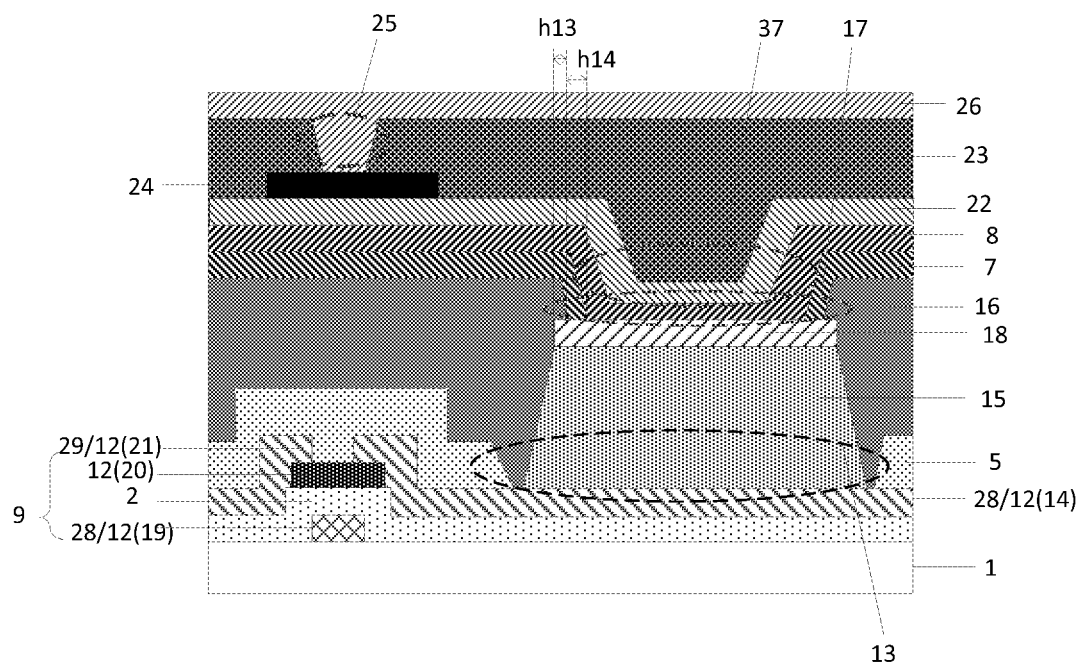
FIG. 1 is a schematic structural diagram of a fingerprint recognition module provided by an embodiment of the present disclosure.

In order to make objectives, technical solutions and advantages of embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, rather than all the embodiments. Further, the embodiments of the present disclosure and features of the embodiments may be combined with each other under a condition of no conflict. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which this present disclosure belongs. "First". "second" and similar words used in the present disclosure do not represent any order, quantity, or importance, but are merely used to distinguish different components. Similar words such as "comprise" or "include" mean that elements or items appearing before the words encompass elements or items recited after the words and their equivalents, but do not exclude other elements or items. Words like "connected" or "linked" are not limited to physical or mechanical connections, but may include electrical connections, whether direct or indirect.

It should be noted that dimensions and shapes of figures in the accompanying drawings do not reflect a real scale, and are only intended to illustrate the present disclosure. The same or similar reference numerals refer to the same or similar elements or elements having the same or similar functions throughout.

In the related art, a TFT optical fingerprint recognition sensor module includes TFT arranged on a base substrate and a photodiode electrically connected to the TFT. A drain of the TFT is used as a bottom electrode of the photodiode, and the photodiode further includes a top electrode and a photoelectric conversion layer between the top electrode and the drain. During implementation, after the photoelectric conversion layer is formed, a planarization layer needs to be formed, a patterning process is adopt to form a via hole exposing part of the photoelectric conversion layer, and the top electrode of the photodiode is formed in the via hole. However, due to a top electrode etching process, an area of the photoelectric conversion layer not covered by the top electrode is large, that is, there is no positive electric field formed by upper and lower electrodes of the photoelectric conversion layer in a region not covered by the top electrode. When voltage is applied to the upper and lower electrodes of an optoelectronic material, due to absence of positive electric field, the optoelectronic material is not completely within a range of an electric field, and carriers in an edge region are slow in speed and are easily captured by defect states in the optoelectronic material. Especially due to process conditions, there are many defect states on a sidewall of the optoelectronic material, and these captured carriers will be released in a next frame of image, resulting in image sticking and affecting image quality.

Based on the above problem in the related art, the embodiments of the present disclosure provide a fingerprint recognition module. As shown in FIG. 1, the fingerprint recognition module includes:

a base substrate 1;

a driving circuit layer 9, disposed on a side of the base substrate 1, and the driving circuit layer 9 includes a plurality of driving transistors 12 arranged in an array;

a first insulating layer 5, disposed on a side of the driving circuit layer 9 facing away from the base substrate 1, and the first insulating layer 5 includes a plurality of first via holes 13 running through the first insulating layer 5 in a thickness direction of the first insulating layer 5;

a plurality of photoelectric converters 15, disposed on a side of the first insulating layer 5 facing away from the driving circuit layer 9), and in contact with first electrodes 14 of the plurality of driving transistors 12 through the plurality of first via holes 13 in one-to-one correspondence;

a second insulating layer 16, disposed on a side of the first insulating layer 5 facing away from the base substrate 1, and the second insulating layer 16 includes a plurality of second via holes 17 in one-to-one correspondence with the plurality of photoelectric converters 15, wherein a distance h13 between an edge of an orthographic projection of a region of a second via hole 17 exposing a corresponding photoelectric converter 15 on the base substrate 1 and an edge of an orthographic projection of a surface of the corresponding photoelectric converter 15 facing away from the base substrate 1 on the base substrate 1 is smaller than or equal to a first preset value; and a plurality of first electrodes 18, disposed on sides of the plurality of photoelectric converters 15 facing away from the driving circuit layer 9, wherein each of the plurality of first electrodes 18 covers, at the corresponding second via hole 17, the corresponding photoelectric converter 15.

In the fingerprint recognition module provided by the embodiments of the present disclosure, an area of each of the plurality of second via holes is increased, so that the distance between the edge of the orthographic projection of a region of a second via hole exposing a corresponding photoelectric converter on the base substrate and the edge of the orthographic projection of a surface of the corresponding photoelectric converter facing away from the base substrate on the base substrate is smaller than or equal to the first preset value. Correspondingly, an area of the first electrode may be increased, an area of the first electrode covering the corresponding photoelectric converter may thereby be increased, a coverage range of an electric field on the photoelectric converters may be enlarged, and a probability of photo-generated carriers being captured by defect states of sidewalls of the photoelectric converters may be reduced, so that the problem of image image-sticking may be solved and an accuracy of fingerprint recognition may be improved.

It should be noted that the fingerprint recognition module provided by the embodiments of the present disclosure is an optical fingerprint recognition module and may identify lines including fingerprints and palm prints.

It should be noted that, in the fingerprint recognition module provided by the embodiments of the present disclosure, a photodiode is constituted by the first electrode of the driving transistor, the photoelectric converter and a first electrode layer.

In some embodiments, a ratio of an area of an orthographic projection of the first electrodes on the base substrate to an area of the orthographic projection of a surface of the corresponding photoelectric converter facing away from the base substrate on the base substrate is larger than or equal to 95% and is smaller than or equal to 100%.

In some embodiments, the first preset value is 2 μm. That is, the distance h13 between the edge of the orthographic projection of the region of the second via hole exposing the corresponding photoelectric converter on the base substrate and the edge of the orthographic projection of the surface of the corresponding photoelectric converter facing away from the base substrate on the base substrate is smaller than or equal to 2 μm.

In some embodiments, the distance h13 between the edge of the orthographic projection, on the base substrate, of the region of the second via hole exposing the corresponding photoelectric converter and the edge of the orthographic projection of the surface of the corresponding photoelectric converter facing away from the base substrate on the base substrate is larger than or equal to 0.5 μm and is smaller than or equal to 2 μm.

During implementation, the first electrodes may first be formed on the sides of the plurality of photoelectric converters facing away from the base substrate, then the second insulating layer is formed, the second via holes exposing the first electrodes are formed in the second insulating layer, and the second insulating layer may cover a part of edges of the first electrode.

In some embodiments, a distance between an edge of the orthographic projection of the first electrodes on the base substrate and the edge of the orthographic projection of the surface of the corresponding photoelectric converter facing away from the base substrate on the base substrate is larger than or equal to 0 μm and is smaller than or equal to 0.5 μm.

In some embodiments, as shown in FIG. 1, the first electrode fully covers the surface of the corresponding photoelectric converter 15 facing away from the base substrate 1. That is, distances between the edges of the first electrode and edges of the surface of the corresponding photoelectric converter facing away from the base substrate are 0 μm.

Of course, in some embodiments, the first electrode may also cover a part of the sidewalls of the corresponding photoelectric converter. That is, the orthographic projection of the surface of the corresponding photoelectric converter facing away from the base substrate on the base substrate is located within the orthographic projection of the first electrode on the base substrate. Therefore, coverage of the electric field on the sidewalls of the photoelectric converters is increased, the probability of the photo-generated carriers being captured by the defect states of the photoelectric converters may be reduced, so that the problem of image image-sticking may be further solved.

Figure 2:
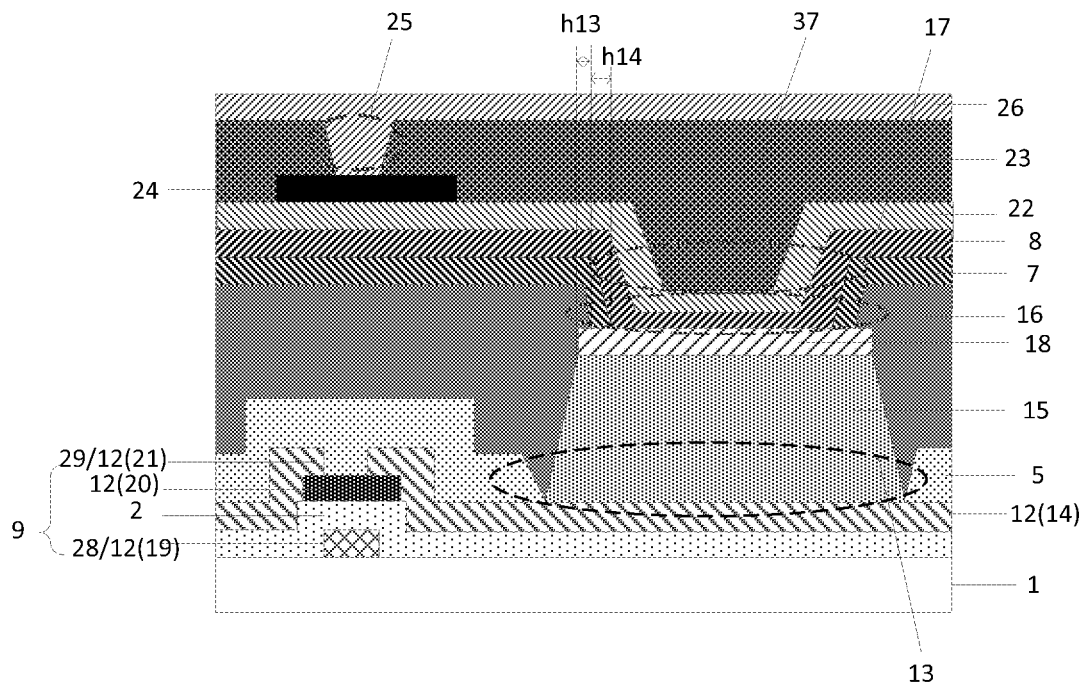
FIG. 2 is a schematic structural diagram of another fingerprint recognition module provided by an embodiment of the present disclosure.

In some embodiments, as shown in FIG. 1 and FIG. 2, an orthographic projection of a photoelectric converter 15 on the base substrate 1 is located within an orthographic projection of a corresponding first via hole 13 on the base substrate 1.

It should be noted that, in a fingerprint recognition module provided in the related art, because of an etching process, a photoelectric conversion layer and a drain have regions that are not connected through direct contact. When voltage is applied to the upper and lower electrodes of the optoelectronic material, the positive electric field is absent in the regions of the photoelectric conversion layer and the drain that are not connected through direct contact, the optoelectronic material is not completely within the range of the electric field, and the carriers in an edge region are slow in speed and are prone to being captured by the defect states in the optoelectronic material. Especially due to process conditions, there are many defect states on the sidewall of the optoelectronic material, and these captured carriers will be released in the next frame of image, resulting in image sticking and affecting image quality.

In the fingerprint recognition module provided by the embodiments of the present disclosure, the orthographic projection of the photoelectric converter on the base substrate is located within the orthographic projection of the corresponding first via hole on the base substrate, so the surfaces of the plurality of photoelectric converters close to the base substrate are completely in contact with the plurality of first electrodes of the driving transistors. Therefore, the probability of the photo-generated carriers being captured by the defect states of the sidewalls of the photoelectric converters may be reduced, so that the problem of image image-sticking may be solved and the accuracy of fingerprint recognition may be improved.

During the implementation, for example, as shown in FIG. 1, an area of the first via hole 13 expositing the first electrode 14 of the driving transistor 12 is larger than an area of the surface of the corresponding photoelectric converter 15 close to the base substrate 1. Or, as shown in FIG. 2, the area of the first via hole 13 expositing the first electrode 14 of the driving transistor 12 is equal to the area of the surface of the corresponding photoelectric converter 15 close to the base substrate 1.

Figure 3:
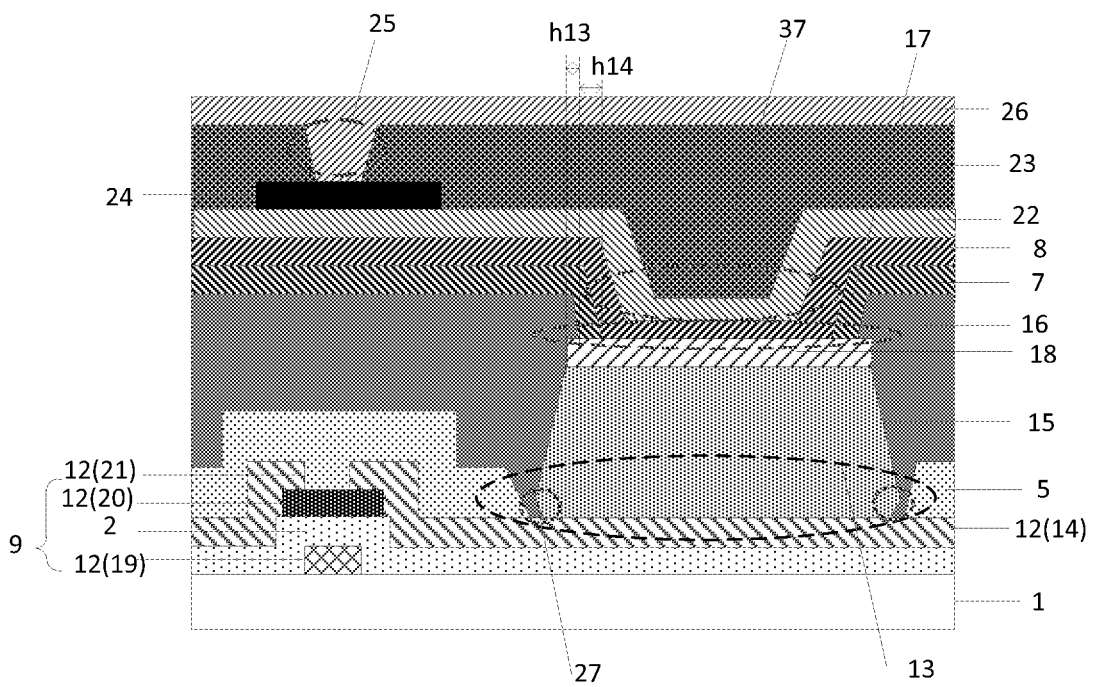
FIG. 3 is a schematic structural diagram of yet another fingerprint recognition module provided by an embodiment of the present disclosure.

In some embodiments, as shown in FIG. 3, a lateral surface of the photoelectric converter 15 has chamfer 27 on a side close to the base substrate 1.

In the fingerprint recognition module provided by the embodiments of the present disclosure, edge of the side of the photoelectric converter close to the base substrate has the chamfer, so that a leakage current on the sidewalls of the photoelectric converters may be reduced and influence of increased leakage current caused by increasing the area of the first electrodes may be reduced. Therefore, the accuracy of fingerprint recognition may be improved.

In some embodiments, the chamfer is an inner chamfer curved toward a center of the photoelectric converter.

In some embodiments, a shape of an orthographic projection of the chamfer on the base substrate is an arc or a zigzag line.

During the implementation, the chamfer may be formed at the edge of the side of the photoelectric converter close to the base substrate through the etching process.

In some embodiments, as shown in FIG. 1, FIG. 2, FIG. 3, and FIG. 4, the driving circuit layer 9 includes:
    a first conducting layer 28, including: control electrodes 19 of the plurality of driving transistors 12, and a plurality of scanning signal lines 30;

a gate insulating layer 2, disposed on a side of the first conducting layer 28 facing away from the base substrate 1;

an active layer 20, disposed on a side of the gate insulating layer 2 facing away from the first conducting layer 28; and a second conducting layer 29, disposed on a side of the active layer 20 facing away from the gate insulating layer 2, and the second conducting layer includes: the first electrodes 14 and second electrodes 21 of the plurality of driving transistors 12, and a plurality of data signal lines 31, wherein the data signal lines 31 and the scanning signal lines 30 intersect with each other to define a plurality of fingerprint recognition units 33, and the data signal lines 31 are electrically connected with the second electrodes 21 of the driving transistors 12.

Figure 4:
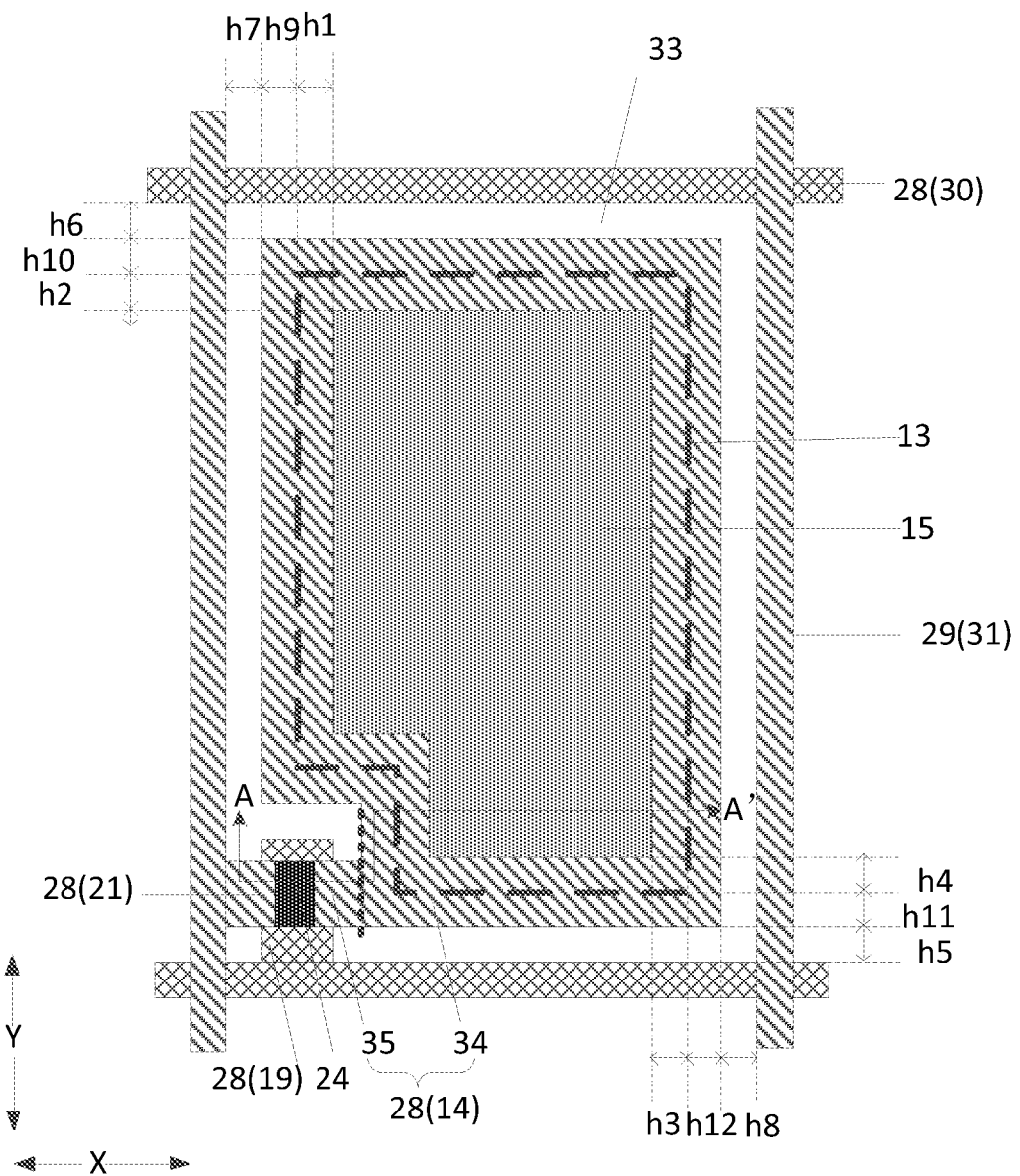
FIG. 4 is a schematic structural diagram of yet another fingerprint recognition module provided by an embodiment of the present disclosure.

It should be noted that, only one fingerprint recognition unit is illustrated in FIG. 4, and description is made by taking the area of the first via hole exposing the first electrode of the driving transistor being larger than the area of the surface of the corresponding photoelectric converter close to the base substrate as an example. FIG. 1 and FIG. 3 may be, for example, a sectional diagram along AA in FIG. 4. In FIG. 1. FIG. 2. FIG. 3 and FIG. 4, description is made by taking the driving transistor being bottom gate structure as an example. Of course, during the implementation, the driving transistor may also be top gate structure, i.e. the active layer is disposed between the control electrode and the base substrates. In FIG. 4, description is made by taking the scanning signal lines 30 extending in a first direction X and the data signal lines 36 extending in a second direction Y as an example. The first direction X is perpendicular to the second direction Y.

In some embodiments, as shown in FIG. 4, the first electrode 14 of each of the plurality of driving transistors includes: a first part 34, and a second part 35 connected with the first part 34:

the orthographic projection of the first via hole 13 on the base substrate 1 is located within an orthographic projection of the first part 34 on the base substrate 1, and a pattern of the orthographic projection of the first via hole 13 on the base substrate 1 is similar to a pattern of the orthographic projection of the first part 34 on the base substrate 1.

In some embodiments, a ratio of the area of the orthographic projection of the photoelectric converter on the base substrate to an area of the orthographic projection of the first via hole on the base substrate is larger than or equal to 90% and is smaller than or equal to 100%.

In some embodiments, as shown in FIG. 4, minimum distances h1, h2, h3 and h4 between edges of the first via holes 13 and the edge of the photoelectric converter 15 is larger than or equal to 0 μm and is smaller than or equal to 2 μm.

In some embodiments, h1=h2=h3=h4.

In some embodiments, as shown in FIG. 4, minimum distances h5 and h6 between edges of the first electrode 14 of the driving transistors and the scanning signal lines 30 are larger than or equal to 3 μm and are smaller than or equal to 5 μm, and minimum distances h7 and h8 between the edges of the first electrodes 14 of the driving transistors and the data signal lines 31 are larger than or equal to 3 μm and are smaller than or equal to 5 μm.

In some embodiments, h5=h6=h7=h8.

In some embodiments, a ratio of the area of the orthographic projection of the first via hole on the base substrate to an area of the orthographic projection of the first part on the base substrate is larger than or equal to 70% and is smaller than or equal to 90%.

In some embodiments, as shown in FIG. 4, minimum distances h9, h10, h11 and h12 between the edges of the first via holes 13 and edges of the first parts 34 are larger than or equal to 3 μm and are smaller than or equal to 5 μm.

In some embodiments, as shown in FIG. 4, the pattern of the orthographic projection of the first via hole 13 on the base substrate is similar to a pattern of the orthographic projection of photoelectric converter 15 on the base substrate.

In some embodiments, as shown in FIG. 1, FIG. 2 and FIG. 3, the fingerprint recognition module further includes:

a third insulating layer 7, disposed on a side of the second insulating layer 16 facing away from the first insulating layer 5, and including a plurality of third via holes 37;

a third conducting layer 8, disposed on a side of the third insulating layer 7 facing away from the second insulating layer 16, and being in contact with the plurality of first electrodes 18 through the plurality of third via holes;

a fourth insulating layer 22, disposed on a side of the third conducting layer 8 facing away from the third insulating layer 7;

a shading metal layer 24, disposed on a side of the fourth insulating layer 22 facing away from the third conducting layer 8, and an orthographic projection of the shading metal layer 24 on the base substrate 1 covers an orthographic projection of the active layer 20 of the driving transistors 12 on the base substrate 1;

a fifth insulating layer 23, disposed on a side of the shading metal layer 24 facing away from the fourth insulating layer 22, and the fifth insulating layer 23 includes fourth via holes 25 running through the fifth insulating layer 23 in a thickness direction of the fifth insulating layer; and a shielding layer 26, disposed on a side of the fifth insulating layer 23 facing away from the shading metal layer 24, and being in contact with the shading metal layer 24 through the fourth via holes 25.

In some embodiments, the driving transistors may be, for example, thin film transistors. Materials of the control electrodes, the first electrodes and the second electrodes of the driving transistors as well as the shading metal layer may be, for example, aluminum, molybdenum, copper or other metal materials. The photoelectric converters include semiconductor electron/intrinsic/hole doped semiconductor materials, such as p-i-n doped amorphous silicon (a-Si) and polycrystalline silicon (p-Si). A material of the active layer of the driving transistors may be, for example, amorphous silicon, polysilicon, indium gallium zinc oxide (IGZO), etc. Materials of the gate insulating layer, the first insulating layer, and the third insulating layer may be, for example, silicon nitride, silicon oxide, etc. A material of the second insulating layer includes, for example, resin. An effect of the second insulating layer is to planarize film layer differences caused by deposition and etching of the photoelectric converters, so as to ensure that the layers above it will not be broken due to climbing caused by the differences. An effect of the third insulating layer is to optimize contact morphology between the planarization layer and the layers above it. Materials of the first electrodes and the third conductive layer are transparent conductive materials, for example, indium tin oxide. The third conducting layer is configured to provide common voltage signals to the first electrodes. An effect of the third insulating layer is to isolate electrical lap joint between the shading metal layer and the third conducting layer. The shading metal layer is an opaque metal layer which prevents light from irradiating channel regions of the driving transistors so as to prevent the active layer from generating relatively large leakage current due to light irradiation. Compared with other insulating layers, the fourth insulating layer is a relatively thick silicon oxide or silicon nitride film, serving to ensure that the fingerprint recognition module has certain resistance to surface scratches. The shielding layer is a layer of transparent conductive film, and its material includes, for example, indium tin oxide, etc. When the fingerprint recognition module provided by the embodiments of the present disclosure is applied to a display product, the shielding layer may shield crosstalk caused by the plurality of signal lines of a display panel on the fingerprint recognition module.

In some embodiments, as shown in FIG. 1 to FIG. 3, a distance h14 between an edge of an orthographic projection of the third via hole 37 on the base substrate 1 and the edge of the orthographic projection of the surface of the corresponding photoelectric converter 15 facing away from the base substrate 1 on the base substrate 1 is larger than or equal to 3 μm s and is smaller than or equal to 6 μm.

Figure 5:
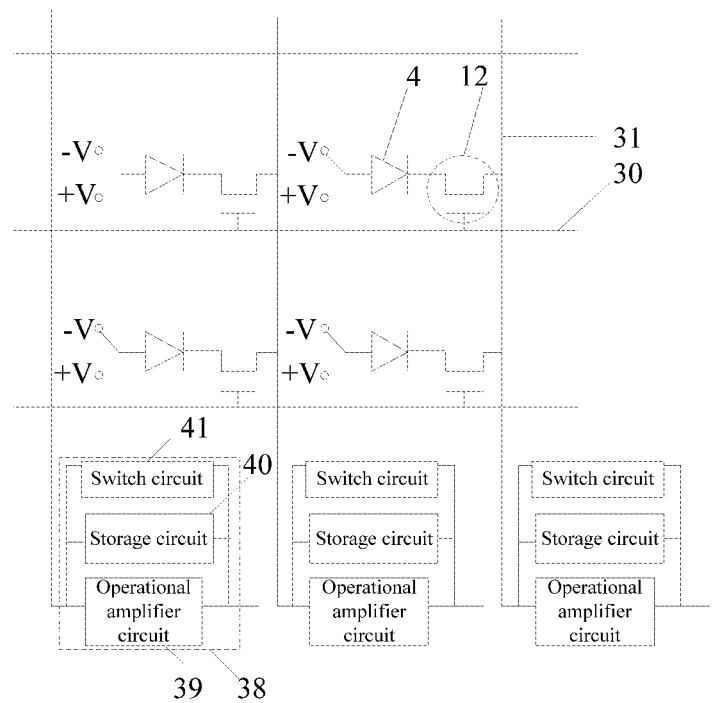
FIG. 5 is a schematic structural diagram of yet another fingerprint recognition module provided by an embodiment of the present disclosure.

In some embodiments, as shown in FIG. 5, the fingerprint recognition module further includes:

a plurality of data reading units 38 electrically connected with the data signal lines 31 in a one-to-one correspondence mode, and each of the plurality of data reading unit includes: an operational amplifier circuit 39, a storage circuit 40, and a switch circuit 41. A first input end of the operational amplifier circuit 39 is coupled to a corresponding data signal line 31, a first end of the storage circuit 40 and a first end of the switch circuit 41, an output end of the operational amplifier circuit 39 is coupled to a second end of the storage circuit 40 and a second end of the switch circuit 41, and the output end of the operational amplifier circuit 39 is configured to output fingerprint recognition signals according to data signals input by the corresponding data signal line 31.

Figure 6:
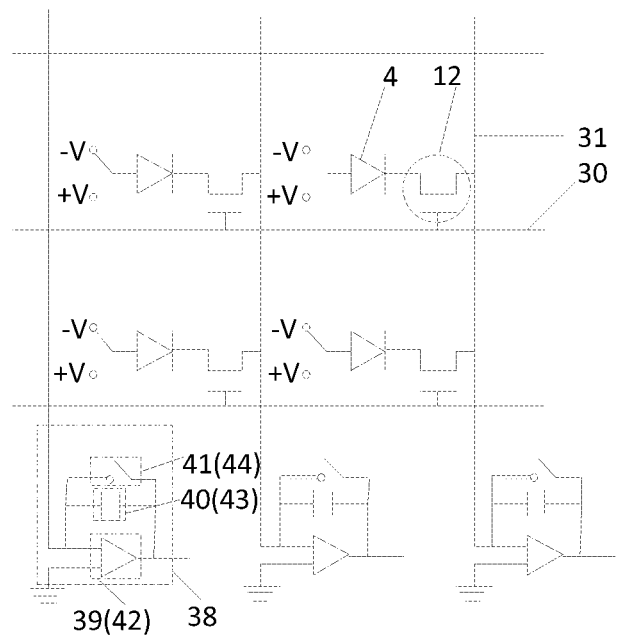
FIG. 6 is a schematic structural diagram of yet another fingerprint recognition module provided by an embodiment of the present disclosure.

In some embodiments, as shown in FIG. 6, the operational amplifier circuit 39 includes: a first amplifier 42:

a first input end of the first amplifier 42 is coupled to the corresponding data signal line 31, the first end of the storage circuit 40 and the first end of the switch circuit 41, and a second input end of the first amplifier 42 is grounded.

In some embodiments, as shown in FIG. 6, the storage circuit 40 includes: a first capacitor 43:

a first electrode of the first capacitor 43 is coupled to the first input end of the operational amplifier circuit 39, and a second electrode of the first capacitor 43 is coupled to the output end of the operational amplifier circuit 39.

In some embodiments, as shown in FIG. 6, the switch circuit 41 includes: a first switch 44;

a first end of the first switch 44 is coupled to the first input end of the operational amplifier circuit 39, and a second end of the first switch 44 is coupled to the output end of the operational amplifier circuit 39.

It should be noted that, a photosensitive diode in FIG. 5 and FIG. 6 includes the photoelectric converters, the first electrodes and the first electrodes of the driving transistors, the third conducting layer electrically connected with the first electrodes is electrically connected to a voltage signal end, and the voltage signal end may provide a positive voltage signal +V or a negative voltage signal −V to the first electrodes.

Figure 7:
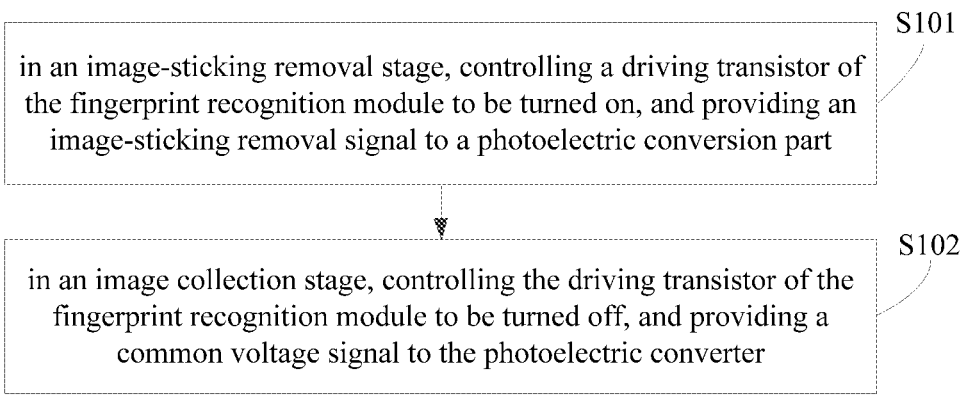
FIG. 7 is a schematic flow diagram of a driving method of a fingerprint recognition module provided by an embodiment of the present disclosure.

A driving method of the above fingerprint recognition module provided by an embodiments of the present disclosure, as shown in FIG. 7, includes:

S101, in an image-sticking removal stage, controlling a driving transistor of the fingerprint recognition module to be turned on, and providing an image-sticking removal signal to a photoelectric conversion part; and S102, in an image collection stage, controlling the driving transistor of the fingerprint recognition module to be turned off, and providing a common voltage signal to the photoelectric converter.

According to the driving method of the fingerprint recognition module provided by the embodiments of the present disclosure, the image-sticking removal stage is added, and the image-sticking removal signal is provided to the plurality of photoelectric converters in the image-sticking removal stage, thus enabling large current to pass an optoelectronic material of the plurality of photoelectric converters, so that defect states in the optoelectronic material may be filled by the large current. In this way, in the subsequent image collection stage, photo-generated carriers generated by the optoelectronic material upon sensing light will not be captured by the defect states, so that a problem of image image-sticking may be solved and an accuracy of fingerprint recognition may be improved.

In some embodiments, the image-sticking removal signal is electrically opposite to the common voltage signal.

In some embodiments, the image-sticking removal signal is a positive voltage signal, and the common voltage signal is a negative voltage signal.

Subsequently, description will be made by taking the fingerprint recognition module as shown in FIG. 6 as an example. In the image collection stage, the photoelectric conversion part receives light irradiation and provides a negative voltage signal to a photodiode. Under a negative voltage signal mode, the driving transistor of the fingerprint recognition module is turned off, and the photodiode is disconnected from a data reading unit, the optoelectronic material in the photoelectric converter generates the photo-generated carriers to accumulate charges. In the image-sticking removal stage, a positive voltage signal is provided to the photodiode, thus enabling the large current to pass the optoelectronic material of the photoelectric converter, so that the defect states in the optoelectronic material may be filled by the large current. Therefore, the photogenerated carriers generated by the optoelectronic material upon sensing the light will not be captured by the defect states, so that image-sticking is reduced.

Figure 8:
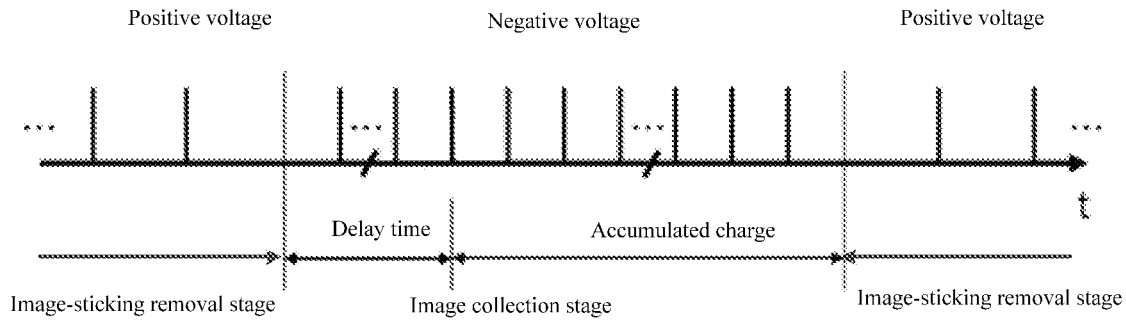
FIG. 8 is a sequence diagram of a driving method of a fingerprint recognition module provided by an embodiment of the present disclosure.

FIG. 8 is a sequence diagram combination of the positive voltage signal and the negative voltage signal. As shown in FIG. 8, frame timing of the image-sticking removal stage is different from frame timing of the image collection stage. At the beginning of fingerprint recognition, the positive voltage signal is applied to each frame. When exposure begins, the frame timing is restored to the frame timing of applying the negative voltage signal and the negative voltage signal is applied. After the frame timing is restored, there will be a short delay (Ndelay) by several frames, so that a detector may adapt to new frame timing and stabilize grayscale values of an image. After the Ndelay, the photodiode collects a light source signal for exposure, accumulates the photo-generated carriers and generates the image until it ends, at which point it reverts to a mode of applying the positive voltage signal.

A display apparatus provided by an embodiments of the present disclosure include the fingerprint recognition module provided by the embodiments of the present disclosure.

In some embodiments, a display panel may be, for example, an electroluminescent display panel, i.e. sub-pixels of the display panel include an electroluminescent device. The electroluminescent device may be, for example, an organic light emitting diode device or a quantum dot light emitting diode device.

The display apparatus provided by the embodiments of the present disclosure is: a mobile phone, a tablet computer, a television, a monitor, a notebook computer, a digital photo frame, a navigator and other products or components with a display function. Other essential components of the display apparatus should be understood by those of ordinary skill in the art, and will not be repeated here, nor should they be regarded as a limitation to the present disclosure. For implementation of the display apparatus, reference may be made to the embodiment of the above display panel, and repeated descriptions will not be repeated.

In conclusion, in the fingerprint recognition module and the driving method thereof and the display apparatus provided by embodiments of the present disclosure, the area of the second via holes of the fingerprint recognition module is increased, so that the distance between the edge of the orthographic projection of the region of the second via hole exposing the corresponding photoelectric converter on the base substrate and the edge of the orthographic projection of the surface of the corresponding photoelectric converter facing away from the base substrate on the base substrate is smaller than or equal to the first preset value. Correspondingly, the area of the first electrode may be increased, the area of the first electrode covering the corresponding photoelectric converter may thereby be increased, the coverage range of the electric field on the photoelectric converters may be enlarged, and the probability of the photo-generated carriers being captured by the defect states of the sidewalls of the photoelectric converters may be reduced, so that the problem of image image-sticking may be solved and an accuracy of fingerprint recognition may be improved.

While preferred embodiments of the present disclosure have been described, additional changes and modifications to these embodiments may be made by those of skill in the art once they are aware of basic inventive concepts. Therefore, the appended claims are intended to be construed to include the preferred embodiments and all changes and modifications that fall within the scope of the present disclosure.

Obviously, those of skill in the art can make various changes and modifications to the embodiments of the present disclosure without departing from the spirit and scope of the embodiments of the present disclosure. Thus, provided that these changes and modifications of the embodiments of the present disclosure fall within the scope of the claims of the present disclosure and their equivalents, the present disclosure is also intended to cover such changes and modifications.

What is claimed is:

1. A fingerprint recognition device, comprising:
   a base substrate;
   a driving circuit layer on a side of the base substrate, wherein the driving circuit layer comprises a plurality of driving transistors arranged in an array;
   a first insulating layer on a side of the driving circuit layer facing away from the base substrate, wherein the first insulating layer comprises a plurality of first via holes running through the first insulating layer in a thickness direction of the first insulating layer;
   a plurality of photoelectric converters on a side of the first insulating layer facing away from the driving circuit layer, and in contact with first electrodes of the plurality of driving transistors through the plurality of first via holes in one-to-one correspondence;
   a second insulating layer on a side of the first insulating layer facing away from the base substrate, wherein the second insulating layer comprises a plurality of second via holes in one-to-one correspondence with the plurality of photoelectric converters, wherein a distance between an edge of an orthographic projection, on the base substrate, of a region of a second via hole exposing a corresponding photoelectric converter and an edge of an orthographic projection, on the base substrate, of a surface of the corresponding photoelectric converter facing away from the base substrate is smaller than or equal to a first preset value;
   a plurality of first electrodes on sides of the plurality of photoelectric converters facing away from the driving circuit layer, wherein each of the plurality of first electrodes covers, at the second via hole, the corresponding photoelectric converter;
   a third insulating layer, disposed on a side of the second insulating layer facing away from the first insulating layer, and comprising a plurality of third via holes;
   a third conducting layer, disposed on a side of the third insulating layer facing away from the second insulating layer, and being in contact with the plurality of first electrodes through the plurality of third via holes;
   a fourth insulating layer, disposed on a side of the third conducting layer facing away from the third insulating layer;
   a shading metal layer, disposed on a side of the fourth insulating layer facing away from the third conducting layer, wherein an orthographic projection of the shading metal layer on the base substrate covers an orthographic projection of the active layer of the driving transistors on the base substrate;
   a fifth insulating layer, disposed on a side of the shading metal layer facing away from the fourth insulating layer, wherein the fifth insulating layer comprises a plurality of fourth via holes running through the fifth insulating layer in a thickness direction of the fifth insulating layer; and
   a shielding layer, disposed on a side of the fifth insulating layer facing away from the shading metal layer, and being in contact with the shading metal layer through the fourth via holes.

2. The fingerprint recognition device according to claim 1, wherein the distance between the edge of the orthographic projection, on the base substrate, of the region of the second via hole exposing the corresponding photoelectric converter and the edge of the orthographic projection, on the base substrate, of the surface of the corresponding photoelectric converter facing away from the base substrate is larger than or equal to 0.5 µm and is smaller than or equal to 2 µm.

3. The fingerprint recognition device according to claim 1, wherein a distance between an edge of an orthographic projection, on the base substrate, of the first electrode and the edge of the orthographic projection, on the base substrate, of the surface of the corresponding photoelectric converter facing away from the base substrate is larger than or equal to 0 µm and is smaller than or equal to 0.5 µm.

4. The fingerprint recognition device according to claim 1, wherein an orthographic projection, on the base substrate, of the photoelectric converter is located within an orthographic projection, on the base substrate, of a corresponding first via hole.

5. The fingerprint recognition device according to claim 1, wherein a first electrode of each of the driving transistors comprises: a first part, and a second part connected with the first part; wherein the orthographic projection, on the base substrate, of the first via hole is located within an orthographic projection, on the base substrate, of the first part, and a pattern of the orthographic projection, on the base substrate, of the first via hole is similar to a pattern of the orthographic projection, on the base substrate, of the first part.

6. The fingerprint recognition device according to claim 5, wherein a ratio of an area of the orthographic projection, on the base substrate, of the first via hole to an area of the orthographic projection, on the base substrate, of the first part is larger than or equal to 70% and is smaller than or equal to 90%.

7. The fingerprint recognition device according to claim 6, wherein a ratio of an area of the orthographic projection, on the base substrate, of the photoelectric converter to the area of the orthographic projection, on the base substrate, of the first via hole is larger than or equal to 90% and is smaller than or equal to 100%.

8. The fingerprint recognition device according to claim 5, wherein the pattern of the orthographic projection, on the base substrate, of the first via hole is similar to a pattern of the orthographic projection, on the base substrate, of the photoelectric converter.

9. The fingerprint recognition device according to claim 1, wherein a lateral surface of the photoelectric converter has a chamfer on a side close to the driving transistor.

10. The fingerprint recognition device according to claim 9, wherein the chamfer is an inner chamfer curved toward a center of the photoelectric converter.

11. The fingerprint recognition device according to claim 9, wherein a shape of an orthographic projection of the chamfer on the base substrate is an arc or a zigzag line.

12. The fingerprint recognition device according to claim 1, wherein the driving circuit layer comprises:

a first conducting layer, comprising: control electrodes of the plurality of driving transistors, and a plurality of scanning signal lines;

a gate insulating layer on a side of the first conducting layer facing away from the base substrate;

an active layer on a side of the gate insulating layer facing away from the first conducting layer; and a second conducting layer on a side of the active layer facing away from the gate insulating layer, wherein the second conducting layer comprises: the first electrodes and second electrodes of the plurality of driving transistors, and a plurality of data signal lines, wherein the data signal lines and the scanning signal lines intersect with each other to define a plurality of fingerprint recognition units, and the data signal lines are electrically connected with the second electrodes of the driving transistors.

13. The fingerprint recognition device according to claim 12, further comprising:

a plurality of data reading units electrically connected with the data signal lines in one-to-one correspondence, wherein the data reading unit comprises: an operational amplifier circuit, a storage circuit, and a switch circuit; wherein a first input end of the operational amplifier circuit is coupled to a corresponding data signal line, a first end of the storage circuit and a first end of the switch circuit, an output end of the operational amplifier circuit is coupled to a second end of the storage circuit and a second end of the switch circuit, and the output end of the operational amplifier circuit is configured to output a fingerprint recognition signal according to a data signal input by the corresponding data signal line.

14. The fingerprint recognition device according to claim 13, wherein the operational amplifier circuit comprises: a first amplifier; wherein a first input end of the first amplifier is coupled to the corresponding data signal line, the first end of the storage circuit and the first end of the switch circuit, and a second input end of the first amplifier is grounded.

15. The fingerprint recognition device according to claim 13, wherein the storage circuit comprises: a first capacitor; wherein a first electrode of the first capacitor is coupled to the first input end of the operational amplifier circuit, and a second electrode of the first capacitor is coupled to the output end of the operational amplifier circuit.

16. The fingerprint recognition device according to claim 13, wherein the switch circuit comprises: a first switch; wherein a first end of the first switch is coupled to the first input end of the operational amplifier circuit, and a second end of the first switch is coupled to the output end of the operational amplifier circuit.

17. The fingerprint recognition device according to claim 1, wherein a distance between an edge of an orthographic projection, on the base substrate, of the third via hole and the edge of the orthographic projection, on the base substrate, of the surface of the photoelectric converter facing away from the base substrate is larger than or equal to 3 μm and is smaller than or equal to 6 μm.

18. A display apparatus, comprising the fingerprint recognition device according to claim 1.

* * * * *